United States Patent [19]

Nitsche

[11] 4,015,173
[45] Mar. 29, 1977

[54] SUPPORT FOR MOUNTING THE ELECTRONIC COMPONENTS OF A SINGLE PHASE UNIT FOR AN INVERTER

[75] Inventor: Herbert Nitsche, Spardorf, Germany

[73] Assignee: Siemens Aktiengesellschaft, Munich, Germany

[22] Filed: May 27, 1975

[21] Appl. No.: 580,773

[30] Foreign Application Priority Data

May 29, 1974 Germany ............................. 2426229

[52] U.S. Cl. .............................. 361/388; 357/81; 321/8 C; 174/16 HS; 361/392
[51] Int. Cl.² .................................................... H05K 7/20
[58] Field of Search .............. 174/16 HS; 317/100; 357/81; 321/8 C

[56] References Cited

UNITED STATES PATENTS

| 3,143,592 | 8/1964 | August ............................. 174/16 HS |
| 3,147,402 | 9/1964 | Hochstetler ........................ 317/100 |
| 3,217,793 | 11/1965 | Coe .................................. 174/16 HS |
| 3,219,885 | 11/1965 | Schniers ........................... 174/16 HS |
| 3,236,296 | 2/1966 | Dubin ............................... 317/100 |
| 3,536,960 | 10/1970 | Otteson ............................ 317/100 |
| 3,564,109 | 2/1971 | Ruechardt ....................... 174/16 HS |
| 3,601,661 | 8/1971 | Kleinhample, Jr. .............. 317/100 |

Primary Examiner—Gerald P. Tolin
Attorney, Agent, or Firm—Kenyon & Kenyon Reilly Carr & Chapin

[57] ABSTRACT

A support for mounting the electronic components of a single phase unit for an inverter, of the type having an H-shaped cross-section in at least one plane disposed perpendicular to the longitudinal axis thereof. The support includes a planar center plate member, and a pair of planar end plate members coupled to the center plate member and disposed in spaced-apart parallel relationship transversely with respect to the plane of the center plate member. The support is self-supporting, and has an H-shaped cross-section in each of the planes thereof disposed perpendicular to the longitudinal axis of the support.

10 Claims, 5 Drawing Figures

SUPPORT FOR MOUNTING THE ELECTRONIC COMPONENTS OF A SINGLE PHASE UNIT FOR AN INVERTER

BACKGROUND OF THE INVENTION

1. Field of the Invention

This invention relates generally to a support for mounting the electronic components of a single phase unit for an inverter which has an H-shaped cross-section in at least one plane disposed perpendicular to the longitudinal axis of the support.

2. Description of the Prior Art

Supports of the above-described type for modular inverter assemblies are known in art. See, for example, page 15 of BBC publication INVERTER INSTALLATIONS FOR ELECTRIC MOTORS. All the electronic components for such a single-phase unit are generally mounted on one support. One known support of the above type is fabricated of a combination of square tubes and separate plates. A central support plate on which the electronic components are mounted has the square tubes fastened at the four corners thereof perpendicular to the plane of the support plate. The configuration of the support through a vertical cross-section taken through the ends of the support plate is accordingly H-shaped. The disadvantage of such supports is that they must be constructed of individual component parts in piecemeal fashion, and the required mechanical stability is only attainable by costly expenditures. Moreover, such known supports provide only two assembly surfaces on the center plate thereof.

SUMMARY OF THE INVENTION

It is therefore an object of the present invention to provide an improved support structure for mounting the electronic components of a single phase unit for an inverter which overcomes the aforementioned disadvantages of heretofore known support structures.

It is also an object of the present invention to provide an improved support structure of the type previously described which can be easily manufactured, fabricated at reasonable cost, and which, in addition, can be utilized to construct modular design inverter units in compact form at low production and testing costs.

These and other objects of the invention are achieved in a support for mounting the electronic components of a single phase unit for an inverter of the type having an H-shaped cross-section in at least one plane disposed perpendicular to the longitudinal axis thereof. The improvement of the invention comprises the support structure comprising a planar center plate member and a pair of planar end plate members coupled to the center plate member and disposed in spaced-apart parallel relationship transversely with respect to the plane of the center plate member.

Such a support construction provides a functional, easily-accessible subassembly design for the control electronics, thyristors, associated commutation elements, and protection circuitry of the inverter. Moreover, such a structure can be utilized to fabricate inverter modules of different power categories, since by appropriately disigning the support, only the electronic components have to be adapted to the power requirements. The support is preferably fabricated of plastic insulation material, since the support can be formed as a single piece by means of an injection molding process and thus provides production advantages. In addition, such plastic makes the support easier to finish for installation of the electronic components of the inverter, which can be directly mounted thereon instead of on two plates fastened to the support. Also, the danger of short circuits is reduced when compared to metal type constructions. And in order to reduce the weight of the structure, provide increased mechanical stability, and improve the ventilation and cooling of the support, the end plate members may include coolant ducts, extending longitudinally therethrough, disposed between the ends of the plate members and the center plate member.

Another advantage of the inventive support is that at least one of the surfaces of the center plate member can be used to mount electronic components. The end plate members of the support extend outwardly, perpendicular to the plane of the center plate member, beyond the electronic components mounted thereon, and thus form a protective space, enclosed by the support on three sides, for the components. Cover plate members may also be fastened to the ends of the end plate members to provide an additional mounting surface facing away from the center plate member of the support. In such an embodiment of the invention, both surfaces of the center plate member can be utilized to mount electronic components and component groups. Functional separation of the components with easy accessibility thereto is thereby achieved. Moreover, the two cover plate members, which are disposed parallel to the center plate member, provide up to four additional assembly planes, a considerable increase in the available assembly surface area. Moreover, the cover plate members, in combination with the support structure, provide a protective enclosure for the electronic components installed in the inner space of the support, which enclosure prevents damage or destruction of the components driving storage or shipping of the modules.

The end plate members may include elongated longitudinal ducts disposed between the center plate member and the cover plate members. These ducts may be utilized to conduct a gaseous coolant through the support, and achieve particularly effective ventilation of the inner assembly spaces by virtue of the "chimney" effect produced thereby. The cover plate members are also preferably fastened by means of hinges disposed parallel to the planes of the center plate member and the end plate members at one of the ends thereof, and are fastened at the other of the ends thereof to the ends of the end plate members by means of fastening means. Such a pivotal mounting of the cover plate members is advantageous in that it permits easy access to the electronic components installed on the center plate member and on the inner surfaces of the cover plate members for the performance of testing and maintenance work.

In another embodiment of the invention, bracket straps are fastened to the ends of the end plate members to which mounting means are attached to provide, on at least the side thereof facing the center plate member, a mounting surface for electronic components or component groups. Heavy components or prewired plates can be mounted and demounted without difficulty in such an arrangement, and the components are easily accessible from the outside of the support after installation for measurement and testing purposes.

In mounting the electronic components of a modular inverter unit on the support, one of the cover plate members may be equipped with electronic control modules for the thyristor assemblies of the inverter. These modules may be mounted with a set of bypass diodes on the side of the center plate member facing the module. Protective circuit elements are mounted on the other side of the center plate member for protecting the thyristor assemblies and the surface of the other cover plate member facing away from the center plate member is equipped with commutation chokes, current limiting chokes, and a commutation capacitor. Such an arrangement provides an optimum functional design having good mechanical stability and accessability, sufficient protection against damage, and adequate ventilation of the components mounted on the support. Such a finished inverter module can be tested after it is manufactured and then stored. The inverter can then be subsequently assembled from such modular units at the particular application site.

It is also preferable that the center plate member be provided with elongated apertures extending therethrough perpendicular to the plane thereof through which the anode and cathode terminals of the thyristors and diodes, which are mounted on the center plate member, extend into the assembly space of the support and are coupled to bus bars. The heat sinks of the assembly are also designed to conduct current. This arrangement enables the circuit interconnection of the thyristor terminals by the bus bars to be located in the space between the center plate member and the rear cover plate member of the support which is not occupied by the thyristors of each assembly. A clear circuit design is obtained with such an arrangement and installation is facilitated.

The center plate member may also have means for anchoring the thyristor assemblies, whose anode and cathode connections extend through the aforementioned apertures provided in the center plate member to the electrically conductive heat sinks. Each thyristor set includes a pair of disc-type thyristors clamped between the described heat sinks, the latter of which are arranged adjacent to each other so that the rotational symmetry axes of each thyristor pair which engage the front surfaces of adjacent heat sinks are positioned approximately parallel. A disc type thyristor is clamped between each pair of heat sinks so that the contact planes thereof are approximately parallel to the front face of the heat sinks. Each of the heat sinks has a right-triangular shape, the sides of which are equal in length, and is arranged so that they form rectangular-shaped modules having a basically square shaped front surface. The use of such a compact unit of an electrically-separated thyristor pair considerably simplifies the equipping of the support.

These and other novel features and advantages of the inventive apparatus will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figure 1:
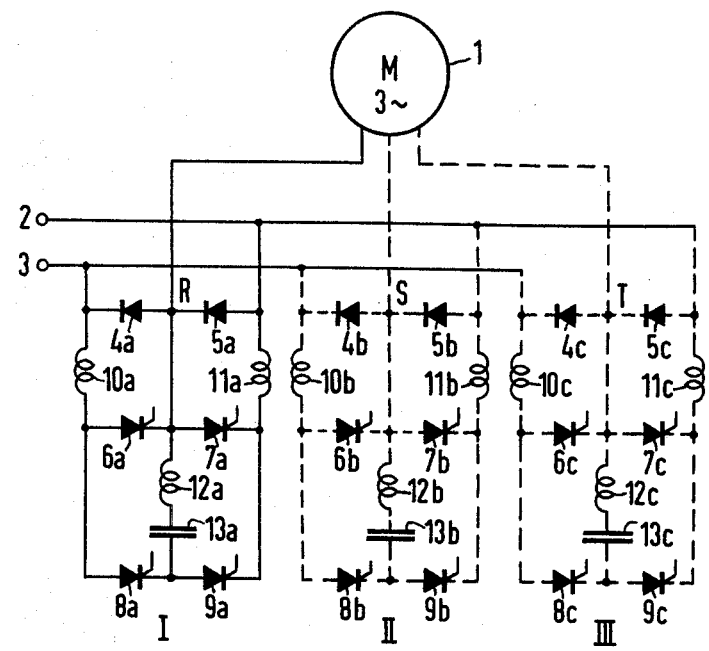
FIG. 1 is a schematic circuit diagram of a line-commutated inverter installation showing the separation thereof into three phase elements or building blocks which are allocated to the three current phases.

Referring now to the drawings, there is shown in FIG. 1 and inverter circuit diagram which is described in DT-PS 1 246 861. The three phase building blocks which make up a single phase are designated I, II and III. The building blocks are coupled in parallel relationship and are connected to a dc voltage source by means of terminals 2 and 3. In the situation wherein the inverter comprises a pulse inverter, terminals 2 and 3 are coupled to the output of the intermediate d-c link, and terminal R (S,T) forms a three-phase output which, in the embodiment of the invention illustrated, is coupled to a three phase motor. Each of the building blocks is constructed in an identical manner, and the following description of building block I is therefore the same for building blocks II and III.

In building block I, controlled main current rectifiers 6a and 7a are coupled to the d-c circuit by means of commutation choke windings 10a and 11a. Diodes 4a and 5a are coupled in parallel relationship to rectifiers 6a and 7a. The three-phase current pahse R is taken off the plate (anode) connection of diode 4a and the cathode terminal of diode 5a. A pair of controlled commutation rectifiers 8a and 9a are coupled in parallel relationship to rectifiers 6a and 7a and comprise means for the forced commutation of the rectifier currents. Commutation rectifier 8a is also coupled in series relationship with commutation capacitor 13a and with a limiting choke winding 12a. Similarly, commutation rectifier 9a is also coupled in series relationship to capacitor 13a and choke winding 12a. Choke winding 12a serves to limit the rate of change of the current flowing through controlled rectifiers 6a and 7a. All the described electronic components required for a phase module can be mounted on a support structure such as that described later on herein. Through the simple interconnection of such prefabricated modules, an inverter can be assembled in a minimum amount of time.

Figure 2:
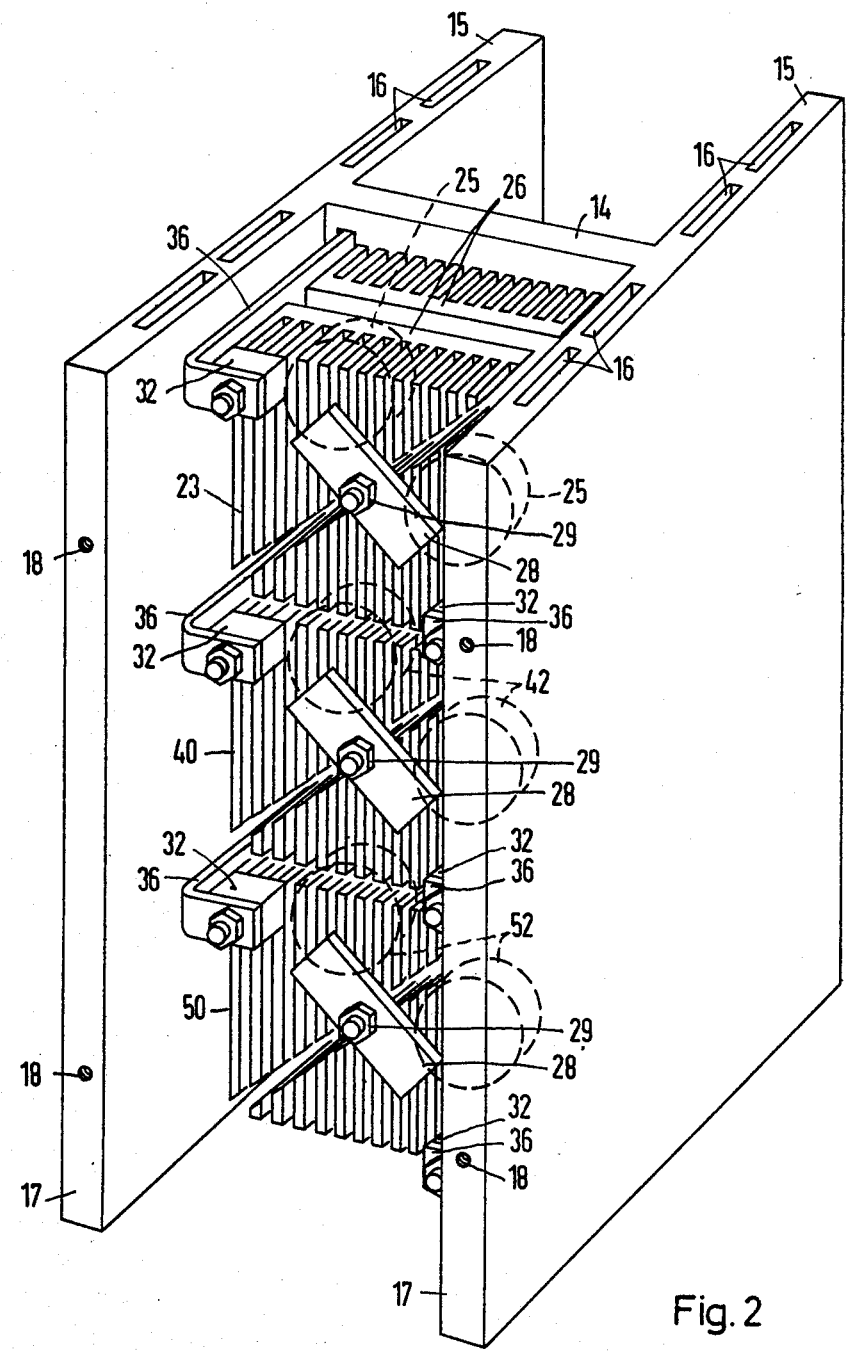
FIG. 2 is a perspective view of one embodiment of an improved support structure constructed according to the invention.

Referring now to FIG. 2, the support of the invention includes a center plate member 14 and a pair of end plate members 15 which are disposed perpendicular to the plane of the center plate member. The end plate members preferably extend outwardly away from the center plate member beyond the electronic components 23 and 28 mounted on centered plate member 14. Protection of the components from damage is therefore provided on at least three sides of the support structure. The support may be fabricated as a single piece of plastic, electrical insulation material, by either, for example, an injection molding process or by reinforcement with fiberglass material, in order to obtain high strength with minimum weight. The support may also be fabricated of metal, but care must be taken to properly insulate the thyristor and diode components of the inverter mounted on the support structure, and in particular the terminals thereof which extend through the center plate member as is described later on herein. In order to reduce the weight of the support, yet still provide good mechanical strength and cooling, end plate members 15 may include elongated ducts 16 extending longitudinally therethrough approximately parallel to the intersection of the center plate member and the end plate members. Such coolant ducts can be formed in the support without any additional manufacturing difficulties using known plastic processing methods. Air may be used as a coolant and flows through ducts 16 and prevents excessive heating of the support by the thyristors 25 and 42 and diodes 52, which are mounted on the support and generate a substantial amount of heat during operation of the inverter.

Figure 3:
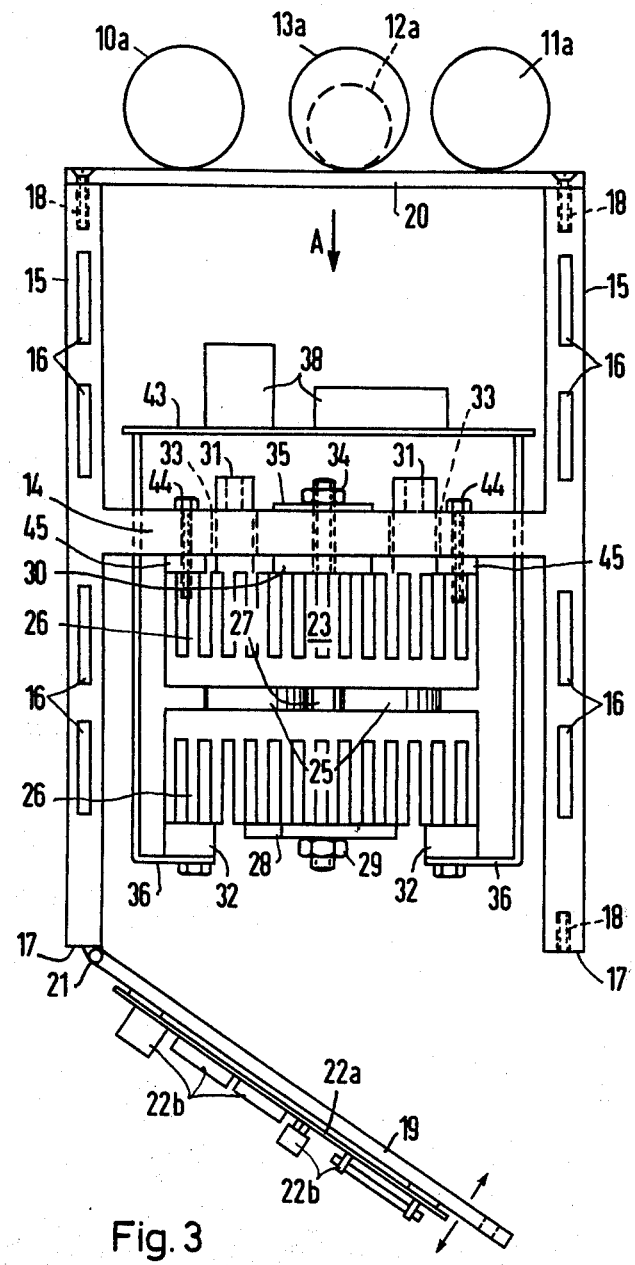
FIG. 3 is a top, plan view of another embodiment of an improved support structure constructed according to the invention.

As shown in FIG. 3, cover plate members 19 and 20 may be fastened to the support across the open ends of the support structure. Fastening means, illustrated as threaded holes 18 disposed in the end faces 17 of end plate members 15, enable the cover plate members to be fastened to the ends of the support structure by means of screws. The width of the cover plate members does not exceed the width of the support structure between the two outer surfaces of the end plate members 15 thereof. This assures the required compactness of the support. The cover plate members may also be fastened at one end to the end plate members by means of hinges 21. Such an arrangement enables easy accessibility to the interior spaces of the support and the components mounted therein. In addition to mounting the electronic control modules (22a and 22b) as illustrated in FIG. 3, these components may be mounted on the interior surface of the cover plate member, and the pivotal mounting of the cover plate members accordingly provides easy access thereto. A pair of hinges can also be fastened to the ends of two of the interior side surfaces of the support which face each other so that the cover plate members can be pivoted about an axis which is perpendicular to the end plate members 15.

Wired circuit boards 22a carrying electronic components 22b of the control modules for the thyristor sets 23 and 24 (which are mounted on the center plate member) are mounted on the outer surface of cover plate member 19 by means of spacers. The control modules transmit the firing pulses to the thyristors, and for this purpose a pulse transformer, and a pulse amplifier, are generally required. If protection of the modules is desired, they can be mounted on the surface of the cover plate member which faces the center plate member 14 of the supports In such an arrangement, a locking fastening means must be provided at the edges of the cover plate member opposite the hinges 21 for fastening the cover plate members to the end plate members of the support so that the control modules may be easily reached.

Figure 4:
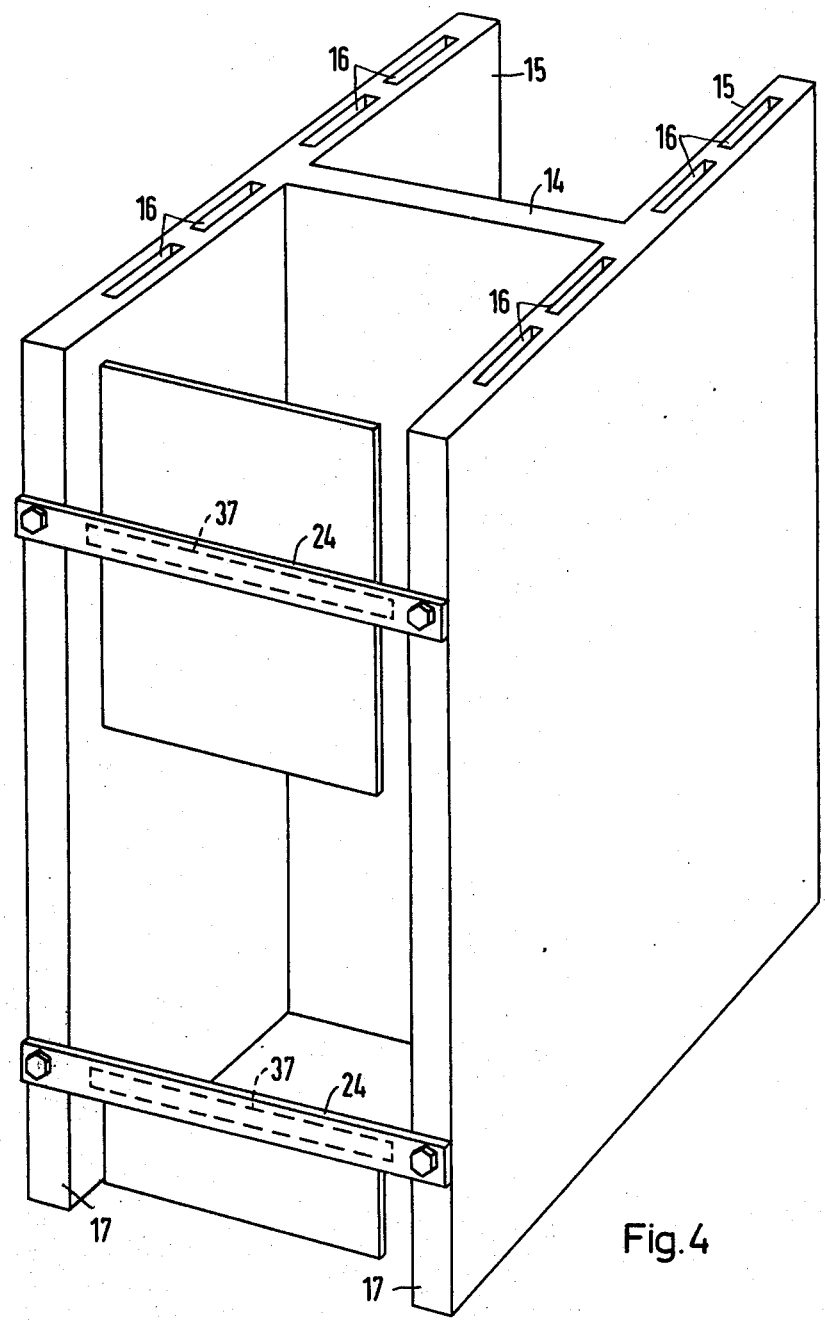
FIG. 4 is a perspective view of still another embodiment of an improved support structure constructed according to the invention.

As shown in FIG. 4, strap brackets 24, which are fastened to the ends of end plate members 15, may be provided in lieu of the cover plate members described previously herein. The control modules may be mounted on the inner surface of the bracket straps so as to be directly accessible. The bracket straps may be provided with plug connectors 37 so that control sets, designed as interchangeable printed circuit boards, can be secured in position thereon while at the same time be easily interchangeable. Instead of such printed circuit boards, heavy components, such as commutation choke windings 10a and 11a can be mounted on the strap brackets.

As can be seen from FIG. 2, the thryristor assemblies 23 and 40 each comprise two pairs of trangular-shaped heat sinks 26 between each pair of which a disc-type thyristor (25 and 42) is disposed. The heat sinks have a right-triangular shape and legs of equal length, and are positioned so that the hypotenuse of one is positioned adjacent the hypotenuse of another. The heat sinks are separated from each other by an electrically insulating air gap. A threaded bolt 27, which jointly clamps two pairs of the heat sinks, is disposed in the air gap between the heat sinks, parallel to the rotational symmetry axes of the thyristors. A common plate of insulating material is disposed on the rear side of both heat sink pairs perpendicular to the bolt. Another insulating piece is disposed on the front side of each heat sink, and the insulating pieces which face each other are bolted by means of spring washer 28 and two nuts 29 and 30. For the purposes of clarity, the insulating elements have not been shown in FIGS. 2 and 3. The converter sets formed by the sinks have a square, block-type configuration which contributes to space saving.

In the embodiment of the invention shown in FIG. 3, the bypass diodes of the circuit of FIG. 1 are replaced by disc-type diodes 52 in the heat sinks 50, the latter of which are identical to the above described thyristor sets. These heat sinks also conduct electrical current, besides cooling the thyristor sets. Terminal lugs 31 and 32 are provided thereon opposite the heat sink surfaces which contact thyristors 25 and 42 and diodes 52. The lugs are electrically conductive and project at right angles from the cooling fins of the heat sinks. When the above described converter components are mounted on the center plate member 14 of the support, the terminal lugs are disposed through apertures 33 provided in the center plate member. Bolt 27 is of such dimensions that it extends beyond screw 30, and may be bolted to the center plate member 14 by means of nut 34 and washer 35. In addition, the heat sinks adjacent to the center plate member 14 are fastened thereto by means of screws 34 and spacers 45.

Figure 5:
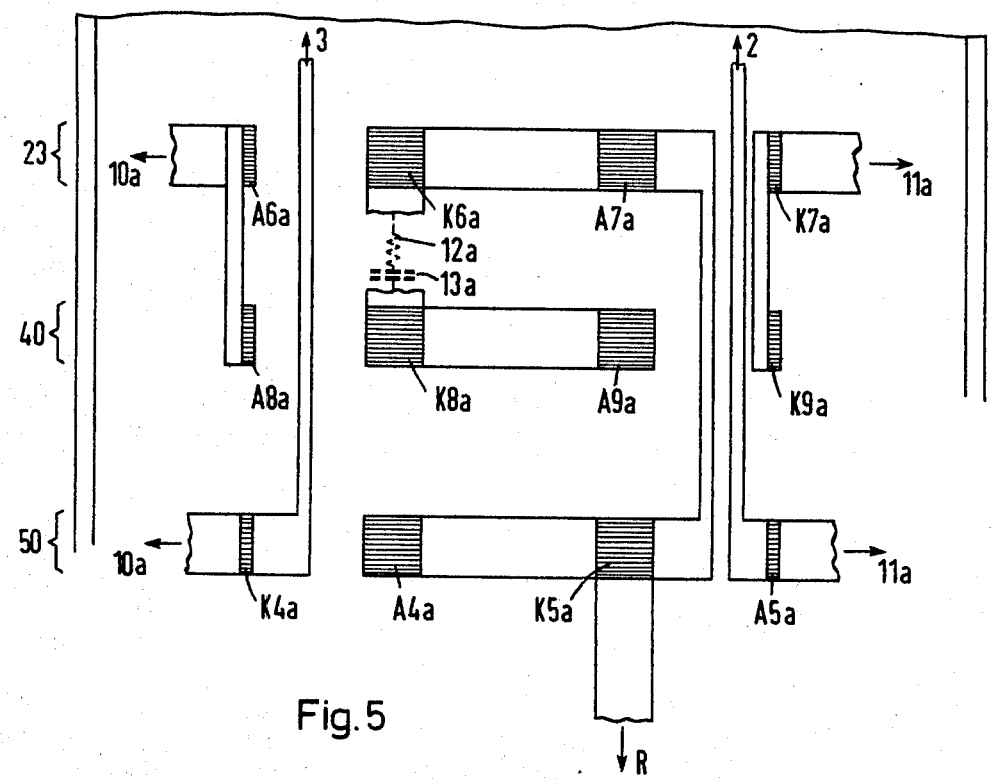
FIG. 5 is a partial, sectional view of the center plate member of the support structure of the invention, showing the thyristor-free assembly space thereof, and the thyristor terminals extending through the center plate member and their interconnection in accordance with the schematic diagram of FIG. 1.

Instead of the above-described controlled converter sets, a module can be used which utilizes stud-type thyristors as the semiconductor diodes. Such a set is known in the art and described in DT-GM 7 239 821. The heat sinks of such a set also serve as current conductors, and the plate (anode) and cathode terminals extend from the rear side of the module through apertures 33 and center plate member 14. The terminal lugs 31 project from the rear heat sink pairs into the thyristor-free assembly space, and the parts thereof located in the apertures in the center plate member prevent the converter modules from turning and transmit the torsional forces resulting from screwing the modules into position to the support where the forces produced are absorbed. Angular bus bars 36 are fastened to the thyristor assembly terminals 32 which face away from the center plate member 14. The bus bars are insulated from the heat sinks and extend through the center plate member from the rear side thereof. The anode and cathode terminals of the thyristors are thus available in the rear assembly space of the support for interconnection, and the circuit connections of the electrodes that are required can be made in a clearly visible and easily wired manner. This will be explained by reference to the phase module designated I in FIG. 1. In that module, thyristors 25 of the converter assembly 23 function as the controlled main rectifiers 6a and 7a of the circuit of FIG. 1, and thyristors 42 of the converter assembly 40 function as the commutation rectifiers 8a and 9a. The two thyristors of each converter module are preferably arranged in a non-parallel manner so that the terminals 31 of converter module 33 extending through center plate member 14 are coupled to the cathode of thyristor 6a and the anode of thyristor 7a. Bus bars 36, which terminate in the thyristor-free assembly space, comprise the anode connection for thyristor 6a and the cathode connection for thyristor 7a. The same is true for thyristor assembly 40. A rearward coupling arrangement is obtained in this manner, as shown in FIG. 5. In the latter illustration, support plate 43, which conceals the terminals, has been removed. The anode terminal of thyristor 6a is designated in this Figure as A6a and the cathode terminal of thyristor 8a as K8a. Terminal A6a is coupled by means of a bus bar to anode terminal A8a, cathode terminal K7a, cathode terminal K6a, anode terminal A7a, cathode terminal K6a, *anode terminal A7a* cathode terminal K8a, and anode terminal A9a. Cathode terminal K6a is coupled by means of commutation capacitor 13a and the limiting choke winding 12a to cathode terminal K8a. The commutation inductance winding 10a is coupled to anode terminal A6, and inductance winding 11a to cathode terminal K7a. Anode terminal A7a is coupled to the junction of the anode of diode 4a and the cathode of diode 5a. After commutation choke windings 10a and 11a are coupled to the cathode of diode 4a and/or the plate of diode 5a, the transmission of d-c current from terminals 2 and 3 to terminals K4a and A5a occurs. Generated phase R of the three-phase system is taken off at the lower end of the support at contact K5a towards the bottom thereof. In this arrangement, the d-c supply and the three-phase current take-off are positioned at opposite ends of the support. FIG. 5 illustrates the simple and practical way in which the connection of the anode and the cathode terminals extending into the thyristor-free space of the support is possible. The connection of the rearward thyristor contacts has not been illustrated for the purposes of clarity.

As shown in FIG. 3, bus bars 36 also function as support elements for the support plate 43. The support plate serves to provide the "support backing effect" for the circuit components 38 which are associated with each thyristor. Each of the thyristors is shunted by an RC circuit by means of a diode.

In the two channels formed in the support by the center plate member, the end plate members and the cover plate members, very effective cooling of the components is obtained because of the "chimney effect—produced thereby. In addition, the openings of the ducts can be easily connected to a forced-air cooling system. Cover plate member 20, which closes off the rear assembly space of the support, also functions as a support surface for the commutation choke windings 10a and 11a, current limiting choke winding 12a, and the commutation capacitor 13a. Depending upon space requirements, the module can either be installed on the side of the cover plate member facing the support, or on the other side thereof which faces away from the support. The three phase modules of the type just described for the construction of an inverter can also be arranged adjacent one another in a suitable cabinet or housing.

In sum, the aforementioned support structure is a strong, easily-fabricated design element for the modular construction of modern inverters. Due to the improved design thereof, an easily accessible functional arrangement of all the required electronic components is achieved.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are accordingly to be regarded in an illustrative, rather than in a restrictive sense.

What is claimed is:

1. In a support for mounting electronic components of a single phase unit for an inverter, said support having an H-shaped cross-section in all cross-sectional planes disposed perpendicular to the longitudinal axis thereof and including a planar center plate member and a pair of planar end plate members coupled to the center plate member and disposed in spaced-apart parallel relationship transversely with respect to the plane of said center plate member, said electronic components being mounted on at least one of the planar surfaces of said center plate member and said end plate members extending transversely with respect to the plane of said center plate member beyond said electronic components mounted thereon, the improvement comprising,
    cover plate members, fastened to the ends of said end plate members and disposed parallel to said center plate member, the surfaces of said cover plate members facing away from said center plate member providing a mounting surface for additional electronic components, said cover plate members having a width which is less than that of said support;
    electronic control means for said electronic components mounted on one of said cover plate members, said components being mounted on the surface of said center plate member which faces said one of said cover plate members and comprising thyristor and diode assemblies and including electrically conductive heat sinks;
    circuit protection means, mounted on the other surface of said center plate member; and
    a commutation choke, a current limiting choke, and a commutation capacitor mounted on the surface of said other of said cover plate members facing said center plate member.

2. The support recited in claim 1, wherein said cover plate members are fastened at one end thereof to the ends of said end plate members by hinge means and at the other end thereof by fastening means, said cover plate members thereby each being pivotable about an axis disposed parallel to the planes of said center plate member and said end plate members.

3. The support recited in claim 2, wherein said center plate member further comprises elongated apertures extending therethrough parallel to the planes of said end plate members, the terminals of said electronic components mounted on said center plate member being received in and extending through said apertures.

4. The support recited in claim 3, wherein each of said thyristor assemblies comprises two disc-type thyristors disposed between a pair of said heat sinks, and wherein each of said diode assemblies comprise two disc-type diodes disposed between a pair of said heat sinks, said heat sink pairs being disposed adjacent one another, and said two thyristors and diodes of each assembly having the rotational symmetry axes thereof disposed in parallel relationship and the surfaces thereof disposed parallel to the surfaces of said heat sinks, said heat sinks having a triangular shape and forming rectangular-shaped modules in conjunction with each other and said thyristors and said diodes.

5. The support recited in claim 4, wherein said support is fabricated of electrically insulating plastic material.

6. The support recited in claim 5, wherein said end plate members include coolant ducts extending longitudinally therethrough and being disposed between said center plate member and the ends of said end plate members.

7. In a support for mounting electronic components of a single phase unit for an inverter, said support having an H-shaped cross-section in at least one plane disposed perpendicular to the longitudinal axis thereof, the improvement comprising, said support including a planar center plate member and a pair of planar end plate members coupled to said center plate member and disposed in spaced-apart parallel relationship transversely with respect to the plane of said center plate member, whereby said support is self-supporting and has an H-shaped cross-section in each of the planes thereof disposed perpendicular to the longitudinal axis of said support, said electronic components being mounted on at least one of the planar sufaces of said center plate member, and said end plate members extending transversely with respect to the plane of said center plate member beyond said electronic components mounted thereon;

cover plate members, fastened to the ends of said end plate members and disposed parallel to said center plate member, the surfaces of said cover plate members facing away from said center plate member providing a mounting surface for additional electronic components, said cover plate members having a width which is less than that of said support and being fastened at one end thereof to the ends of said end plate members by hinge means and at the other end thereof by fastening means, said cover plate members thereby each being pivotable about an axis disposed parallel to the planes of said center plate member and said end plate members;

electronic control means for said electronic components mounted on one of said cover plate members, said components being mounted on the surface of said center plate member which faces said one of said cover plate members;

circuit protection means, mounted on the other surface of said center plate member; and a commutation choke, a current limiting choke, and a commutation capacitor mounted on the surface of said other of said cover plate members facing away from said center plate member;

said center plate member further comprising elongated apertures extending therethrough parallel to the planes of said end plate members, the terminals of said electronic components mounted on said center plate member being received in and extending through said apertures and comprising thyristor assemblies and including electrically conducting heat sinks, each of said thyristor assemblies comprising two disc-type thyristors disposed between a pair of said heat sinks, said heat sink pairs being disposed adjacent one another, and said two thyristors of each assembly having the rotational symmetry axes thereof disposed in parallel relationship and the surfaces thereof disposed parallel to the surfaces of said heat sinks, said heat sinks having a triangular shape and forming rectangular-shaped modules in conjunction with each other and said thyristors.

8. The support recited in claim 7, wherein said support is fabricated of electrically insulating plastic material.

9. The support recited in claim 7, wherein said end plate members include coolant ducts extending longitudinally therethrough and being disposed between said center plate member and the ends of said end plate members.

10. The support recited in claim 7, further comprising a plurality of strap bracket members, fastened to the ends of said end plate members and disposed parallel to said center plate member, and means, disposed on the surfaces of said strap bracket members, facing said center plate member, for mounting electronic components thereon.

* * * * *